United States Patent
Sun et al.

(10) Patent No.: US 10,857,764 B2
(45) Date of Patent: Dec. 8, 2020

(54) METHOD FOR IMPROVING ADHESION BETWEEN GLASS COVER AND ENCAPSULANT FOR SOLAR ROOF TILES

(71) Applicant: TESLA, INC., Palo Alto, CA (US)

(72) Inventors: Zhi-Wen Sun, Sunnyvale, CA (US); Ollivier J. Lefevre, Pleasanton, CA (US); Jiunn Benjamin Heng, La Rena Lane, CA (US)

(73) Assignee: Tesla, Inc., Palo Alto, CA (US)

( * ) Notice: Subject to any disclaimer, the term of this patent is extended or adjusted under 35 U.S.C. 154(b) by 200 days.

(21) Appl. No.: 15/659,424

(22) Filed: Jul. 25, 2017

(65) Prior Publication Data

US 2019/0030867 A1 Jan. 31, 2019

(51) Int. Cl.
*B32B 17/10* (2006.01)
*G02B 1/12* (2006.01)
(Continued)

(52) U.S. Cl.
CPC .. *B32B 17/10688* (2013.01); *B32B 17/10018* (2013.01); *B32B 17/10761* (2013.01);
(Continued)

(58) Field of Classification Search
CPC . C03C 23/0075; C03C 17/245; C03C 17/225; B08B 3/12; C23C 14/5873;
(Continued)

(56) References Cited

U.S. PATENT DOCUMENTS

| | | |
|---|---|---|
| 3,076,861 A | 2/1963 | Samulon |
| 3,369,939 A | 2/1968 | Myer |

(Continued)

FOREIGN PATENT DOCUMENTS

| | | |
|---|---|---|
| CN | 102544380 | 8/2015 |
| CN | 103426957 | 3/2016 |

(Continued)

OTHER PUBLICATIONS

Bulucani et al., "A new approach: low cost masking material and efficient copper metallization for higher efficiency silicon solar cells" 2015 IEEE.

(Continued)

*Primary Examiner* — Alex A Rolland
(74) *Attorney, Agent, or Firm* — Dentons US LLP

(57) ABSTRACT

Treatments are provided to strengthen adhesion of an optical filter layer in a photovoltaic (PV) module to an encapsulant layer, or generally, between inorganic materials and organic polymers. The embodiments disclosed herein can provide five or more times the adhesive forces of untreated encapsulant-filter interfaces. As a result, the system can enhance long-term reliability of PV modules by reducing interface surface charges and dangling bonds and reducing gaps and cracks, thereby preventing moisture, impurities, and particles from entering the interface. The treated optical filter layer can result in a surface modification. In some embodiments, treating the optical filter layer includes applying a chemical treatment such as an acid or alkaline wash, and/or ultrasonic cleaning.

15 Claims, 9 Drawing Sheets

(51) Int. Cl.
*H01L 31/048* (2014.01)
*H02S 20/22* (2014.01)
*H02S 40/20* (2014.01)
*H01L 31/054* (2014.01)
*H02S 99/00* (2014.01)
*H02S 20/25* (2014.01)
*H01L 31/02* (2006.01)

(52) U.S. Cl.
CPC .. *B32B 17/10788* (2013.01); *B32B 17/10981* (2013.01); *G02B 1/12* (2013.01); *H01L 31/02* (2013.01); *H01L 31/048* (2013.01); *H01L 31/054* (2014.12); *H02S 20/22* (2014.12); *H02S 20/25* (2014.12); *H02S 40/20* (2014.12); *H02S 99/00* (2013.01)

(58) Field of Classification Search
CPC ... C23C 14/58; G02B 1/113; H01L 31/02167; B32B 17/10981; B32B 17/10688
See application file for complete search history.

(56) References Cited

U.S. PATENT DOCUMENTS

| | | | |
|---|---|---|---|
| 3,461,602 A | 8/1969 | Hasel | |
| 4,239,810 A | 12/1980 | Alameddine | |
| 4,724,011 A | 2/1988 | Turner | |
| 5,118,540 A | 6/1992 | Hutchison | |
| 5,338,369 A | 8/1994 | Rawlings | |
| 5,427,961 A | 6/1995 | Takenouchi | |
| 5,667,596 A | 9/1997 | Tsuzuki | |
| 5,942,048 A | 8/1999 | Fujisaki | |
| 6,133,522 A | 10/2000 | Kataoka | |
| 6,311,436 B1 | 11/2001 | Mimura | |
| 6,365,824 B1 | 4/2002 | Nakazima | |
| 6,472,594 B1 | 10/2002 | Ichinose | |
| 6,586,271 B2 | 7/2003 | Hanoka | |
| 6,960,716 B2 | 11/2005 | Matsumi | |
| 7,259,321 B2 | 8/2007 | Oswald | |
| 7,276,724 B2 | 10/2007 | Sheats | |
| 7,506,477 B2 | 3/2009 | Flaherty | |
| 7,534,956 B2 | 5/2009 | Kataoka | |
| 7,772,484 B2 | 8/2010 | Li | |
| 7,833,808 B2 | 11/2010 | Xu | |
| 7,851,700 B2 | 12/2010 | Luch | |
| 7,858,874 B2 | 12/2010 | Ruskin | |
| 7,902,451 B2 | 3/2011 | Shimizu | |
| 7,964,440 B2 | 6/2011 | Salleo | |
| 8,205,400 B2 | 6/2012 | Allen | |
| 8,206,664 B2 | 6/2012 | Lin | |
| 8,276,329 B2 | 10/2012 | Lenox | |
| 8,471,141 B2 | 6/2013 | Stancel | |
| 8,664,030 B2 | 3/2014 | Luch | |
| 8,674,377 B2 | 3/2014 | Farquhar | |
| 8,701,360 B2 | 4/2014 | Ressler | |
| 8,713,861 B2 | 5/2014 | Desloover | |
| 8,822,810 B2 | 9/2014 | Luch | |
| 9,038,330 B2 | 5/2015 | Bellavia | |
| 9,150,966 B2 | 10/2015 | Xu | |
| 9,206,520 B2 | 12/2015 | Barr | |
| 9,343,592 B2 | 5/2016 | Hunt | |
| 9,362,527 B2 | 6/2016 | Takemura | |
| 9,412,884 B2 | 8/2016 | Heng | |
| 9,525,092 B2 | 12/2016 | Mayer | |
| 9,825,582 B2 | 11/2017 | Fernandes | |
| 9,899,554 B2 | 2/2018 | Yang | |
| 9,966,487 B2 | 5/2018 | Magnusdottir | |
| 2001/0054435 A1 | 12/2001 | Nagao | |
| 2002/0015782 A1 | 2/2002 | Abys | |
| 2003/0180983 A1 | 9/2003 | Oswald | |
| 2004/0261840 A1 | 12/2004 | Schmit | |
| 2005/0039788 A1 | 2/2005 | Blieske | |
| 2005/0268963 A1 | 12/2005 | Jordan | |
| 2006/0048798 A1* | 3/2006 | McCoy | B08B 3/08 134/40 |
| 2006/0086620 A1 | 4/2006 | Chase | |
| 2006/0204730 A1 | 9/2006 | Nakamura | |
| 2008/0135085 A1 | 6/2008 | Corrales | |
| 2009/0101192 A1 | 4/2009 | Kothari | |
| 2009/0120497 A1 | 5/2009 | Schetty | |
| 2009/0133739 A1 | 5/2009 | Shiao | |
| 2009/0133740 A1 | 5/2009 | Shiao | |
| 2009/0233083 A1 | 9/2009 | Inoue | |
| 2009/0242021 A1* | 10/2009 | Petkie | H01L 31/02168 136/256 |
| 2009/0287446 A1 | 11/2009 | Wang | |
| 2009/0308435 A1 | 12/2009 | Caiger | |
| 2010/0000603 A1 | 1/2010 | Tsuzuki | |
| 2010/0006147 A1 | 1/2010 | Nakashima | |
| 2010/0018568 A1 | 1/2010 | Nakata | |
| 2010/0132762 A1 | 6/2010 | Graham | |
| 2010/0147363 A1 | 6/2010 | Huang | |
| 2010/0180929 A1 | 7/2010 | Raymond | |
| 2011/0023937 A1 | 2/2011 | Daniel | |
| 2011/0023942 A1 | 2/2011 | Soegding | |
| 2011/0030761 A1 | 2/2011 | Kalkanoglu | |
| 2011/0277825 A1 | 11/2011 | Fu | |
| 2012/0012162 A1 | 1/2012 | Kobayashi | |
| 2012/0031470 A1 | 2/2012 | Dimov | |
| 2012/0048349 A1 | 3/2012 | Metin | |
| 2012/0060911 A1 | 3/2012 | Fu | |
| 2012/0125391 A1 | 5/2012 | Pinarbasi | |
| 2012/0199184 A1 | 8/2012 | Nie | |
| 2012/0237670 A1 | 9/2012 | Lim | |
| 2013/0048062 A1 | 2/2013 | Min | |
| 2013/0061913 A1 | 3/2013 | Willham | |
| 2013/0160823 A1 | 6/2013 | Khouri | |
| 2013/0206213 A1 | 8/2013 | He | |
| 2013/0209776 A1 | 8/2013 | Kim | |
| 2013/0233378 A1 | 9/2013 | Moslehi | |
| 2013/0247959 A1 | 9/2013 | Kwon | |
| 2013/0255755 A1 | 10/2013 | Chich | |
| 2013/0280521 A1 | 10/2013 | Mori | |
| 2014/0120699 A1 | 5/2014 | Hua | |
| 2014/0124014 A1 | 5/2014 | Morad | |
| 2014/0196768 A1 | 7/2014 | Heng et al. | |
| 2014/0313574 A1 | 10/2014 | Bills | |
| 2014/0360582 A1 | 12/2014 | Cui | |
| 2015/0090314 A1 | 4/2015 | Yang | |
| 2015/0155824 A1 | 6/2015 | Chien | |
| 2015/0194552 A1 | 7/2015 | Ogasahara | |
| 2015/0243931 A1 | 8/2015 | Fukuura | |
| 2015/0270410 A1 | 9/2015 | Heng | |
| 2015/0349145 A1 | 12/2015 | Morad | |
| 2015/0349152 A1 | 12/2015 | Voss | |
| 2015/0349703 A1 | 12/2015 | Morad | |
| 2016/0013329 A1 | 1/2016 | Brophy | |
| 2016/0105144 A1 | 4/2016 | Haynes | |
| 2016/0163902 A1 | 6/2016 | Podlowski | |
| 2016/0181446 A1 | 6/2016 | Kalkanoglu | |
| 2016/0225931 A1 | 8/2016 | Heng | |
| 2017/0033250 A1* | 2/2017 | Ballif | G02B 5/0278 |
| 2017/0077343 A1 | 3/2017 | Morad | |
| 2017/0194516 A1 | 7/2017 | Reddy | |
| 2017/0222082 A1 | 8/2017 | Lin | |
| 2018/0166601 A1 | 6/2018 | Inaba | |

FOREIGN PATENT DOCUMENTS

| | | |
|---|---|---|
| CN | 102956730 | 6/2016 |
| DE | 102007054124 | 5/2009 |
| EP | 1058320 | 12/2000 |
| EP | 2051124 A2 | 4/2009 |
| EP | 2709160 | 3/2014 |
| GB | 2278618 | 12/1994 |
| JP | S57141979 | 9/1982 |
| JP | S6020586 | 2/1985 |
| JP | H06140657 | 5/1994 |
| JP | H06264571 | 9/1994 |
| JP | 2000091610 | 3/2000 |
| JP | 2000216415 | 8/2000 |
| JP | 2013211385 | 10/2013 |
| WO | 2008136872 | 11/2008 |
| WO | 2009062106 | 5/2009 |

(56) References Cited

FOREIGN PATENT DOCUMENTS

| WO | 2009099418 | 8/2009 |
|----|------------|--------|
| WO | 2010128375 | 11/2010 |
| WO | 2011128757 | 10/2011 |
| WO | 201359441 | 4/2013 |
| WO | 2013067541 | 5/2013 |
| WO | 2013102181 | 7/2013 |
| WO | 2014178180 | 11/2014 |
| WO | 2015155356 | 10/2015 |
| WO | 2016090341 | 6/2016 |

OTHER PUBLICATIONS

Fan et al., "Laser micro machined wax-covered plastic paper as both sputter deposition shadow masks and deep-ultraviolet patterning masks for polymethylmacrylate-based microfluidic systems" via google scholar, downloaded Mar. 31, 2016.
"An inorganic/organic hybrid coating for low cost metal mounted dye-sensitized solar cells" Vyas, N. et al.
"Recovery Act: Organic Coatings as Encapsulants for Low Cost, High Performance PV Modules" Jim Poole et al. Nov. 16, 2011.
Pelisset: "Efficiency of Silicon Thin-Film photovoltaic Modules with a Front Coloured Glass", Preceedings CISBAT 2011, Jan. 1, 2011, pp. 37-42, XP055049695, the Whole Document.

\* cited by examiner

METHOD FOR IMPROVING ADHESION BETWEEN GLASS COVER AND ENCAPSULANT FOR SOLAR ROOF TILES

BACKGROUND

Field

This disclosure is generally related to reliability of photovoltaic (or "PV") modules or roof tiles. More specifically, this disclosure is related to treating an optical filter layer to strengthen adhesion in colored photovoltaic roof tiles.

Related Art

For a number of important applications, particularly solar panel technology, it is desirable to adhere a layer of inorganic coating material to an organic material, such as a polymer. A typical PV module can include a two-dimensional array (e.g., 6×12) of solar cells. A PV roof tile (or solar roof tile) can be a particular type of PV module shaped like a roof tile and enclosing fewer solar cells than a conventional solar panel, and can include one or more solar cells encapsulated between a front cover and a back cover. These covers can be glass or other material that can protect the solar cells from the weather elements. Note that a typical rooftop tile may have an area 15 in×8 in=120 in$^2$=774 cm$^2$. The array of solar cells can be sealed with an encapsulating layer, such as an organic polymer, between the front and back covers.

Conventionally, the color of a PV module or solar roof tile corresponds to the natural color of the solar cells, which can be blue, dark-blue, or black. A number of techniques are available to improve the color appearance of a PV module so that, for example, the module matches the color of a building, or the module's appearance can conceal the solar cells.

One such color-management technique involves depositing an optical filter, such as a layer of transparent conducting oxide (TCO), within the PV module, e.g., on the inner surface of a front glass cover. However, the optical filter and the encapsulant layer can separate over time, which can allow moisture to enter the PV module. Particularly, if there is insufficient adhesion between the inorganic optical filter layer and the organic polymer encapsulant, delamination can occur after a large number of thermal cycles.

SUMMARY

One embodiment described herein provides a process for strengthening adhesion of an optical filter layer to an encapsulant layer in a photovoltaic (PV) roof tile. The process comprises coating an optical filter layer on a bottom surface of the glass cover. The process then comprises treating the optical filter layer to reduce surface imperfections. The process then comprises laminating an encapsulant layer on one or more PV cells. The process then comprises sealing the one or more laminated PV cells with the glass cover. In this embodiment, the treated optical filter layer results in a surface modification.

In a variation on this embodiment, the optical filter layer comprises one or more of: a transparent conducting oxide (TCO); a silicon nitride ($Si_xN_y$); a silicon oxide ($SiO_x$); a material with a refraction index between 1.7 and 2.5; a material with a refraction index between 1.2 and 1.5; and a metal.

In a variation on this embodiment, treating the optical filter layer comprises applying a chemical treatment to the optical filter layer.

In a variation on this embodiment, the chemical treatment includes treating the optical filter layer with one or more of: an inorganic acid; an inorganic alkaline; an organic acid; an organic phosphonic acid; a sodium hydroxide (NaOH) solution; isopropyl alcohol (IPA); hydroxyl-ethylidene-diphosphonic acid (HEDP); a weak acidic wash or dip; and a weak alkaline wash or dip.

In a variation on this embodiment, treating the optical filter layer includes ultrasonic cleaning.

In a variation on this embodiment, ultrasonic cleaning involves using one or more of: isopropyl alcohol (IPA); and a cleaning solvent.

In another aspect of this disclosure, the process further comprises producing a surface texture or roughness on the bottom surface of the glass.

In a variation on this embodiment, the strengthened adhesion prevents moisture from entering an interface between the encapsulant layer and the optical filter layer.

Another embodiment described herein provides a process for strengthening adhesion of an inorganic material layer to an organic material layer. The process comprises applying a chemical treatment or ultrasonic cleaning. In this embodiment, the chemical treatment or ultrasonic cleaning reduces surface imperfections associated with an interface between the organic material layer and the inorganic material layer. The chemical treatment or ultrasonic cleaning further results in a surface modification.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the disclosed system is not limited to the embodiments shown, but is to be accorded the widest scope consistent with the principles and features disclosed herein.

Overview

Embodiments of the disclosed system solve the problem of strengthening adhesion between an optical filter layer and an encapsulation layer in a PV module by treating the optical filter layer. The disclosed system and methods can provide five or more times the adhesive forces of untreated encapsulant-filter interfaces. As a result, the system can enhance long-term reliability of PV modules by reducing interface surface charges and dangling bonds and reducing gaps and cracks, thereby preventing moisture, impurities, and particles from entering the interface. Note that the embodiments disclosed herein are not limited to usage in PV technology, and can be applied to strengthen adhesion between inorganic and organic materials in general.

The treatment can induce a surface modification to the optical filter layer. Treating the optical filter layer can include applying a chemical treatment such as an acid or alkaline wash or dip (e.g., a 2-4 minute rinse in 2-4% NaOH solution), and/or ultrasonic cleaning.

PV Roof Tiles and Modules

Figure 1:
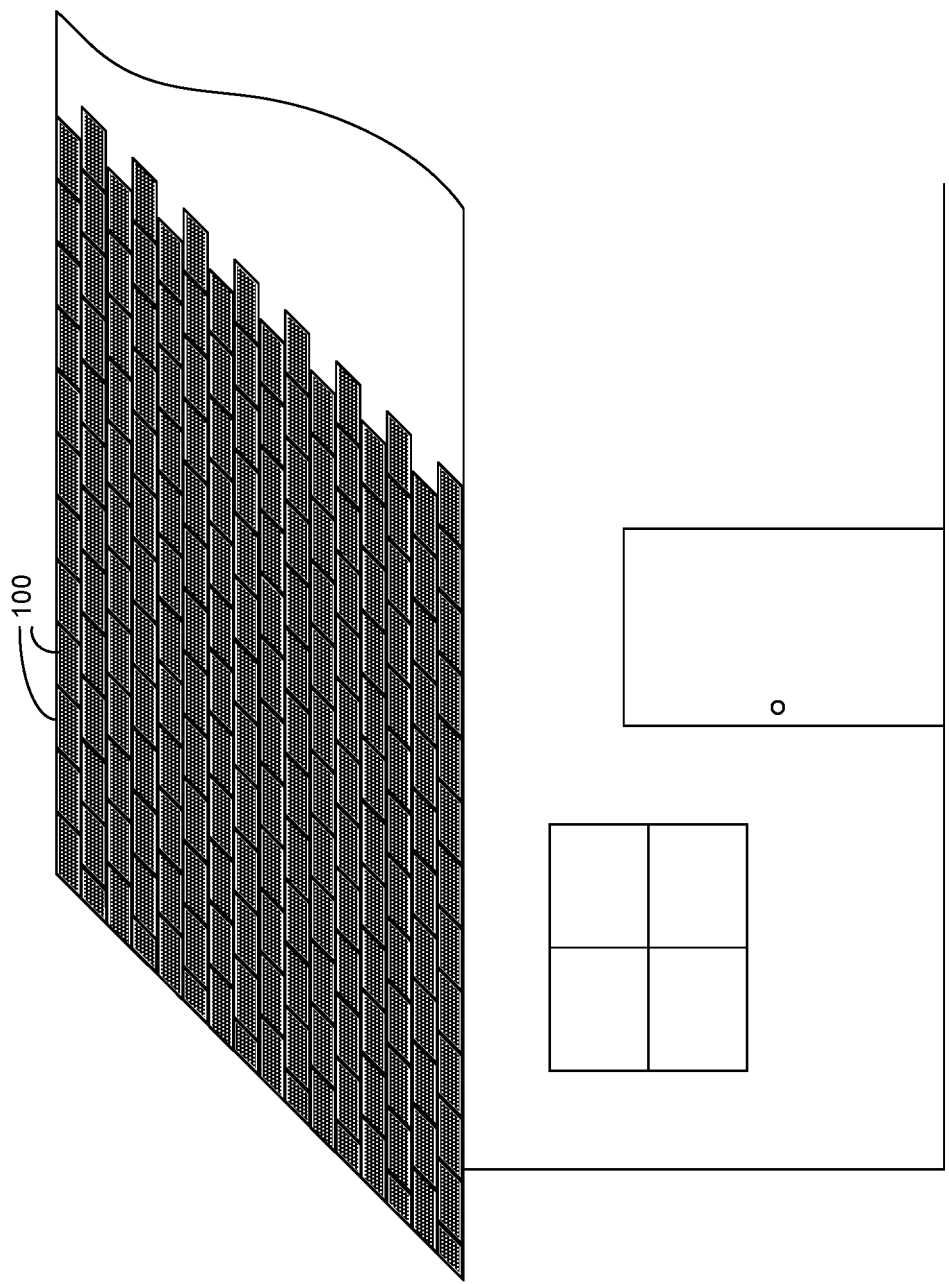
FIG. 1 shows an exemplary configuration of photovoltaic roof tiles on a house.

The disclosed system and methods may be used to strengthen adhesion of optical filter layers in PV roof tiles and/or PV modules. Such PV roof tiles can function as solar cells and roof tiles at the same time. FIG. 1 shows an exemplary configuration of PV roof tiles on a house. PV roof tiles 100 can be installed on a house like conventional roof tiles or shingles. Particularly, a PV roof tile can be placed with other tiles in such a way to prevent water from entering the building.

A respective solar cell can include one or more electrodes such as busbars and finger lines, and can connect mechanically and electrically to other cells. Solar cells can be electrically coupled by a tab, via their respective busbars, to create in-series or parallel connections. Moreover, electrical connections can be made between two adjacent tiles, so that a number of PV roof tiles can jointly provide electrical power.

Figure 2:
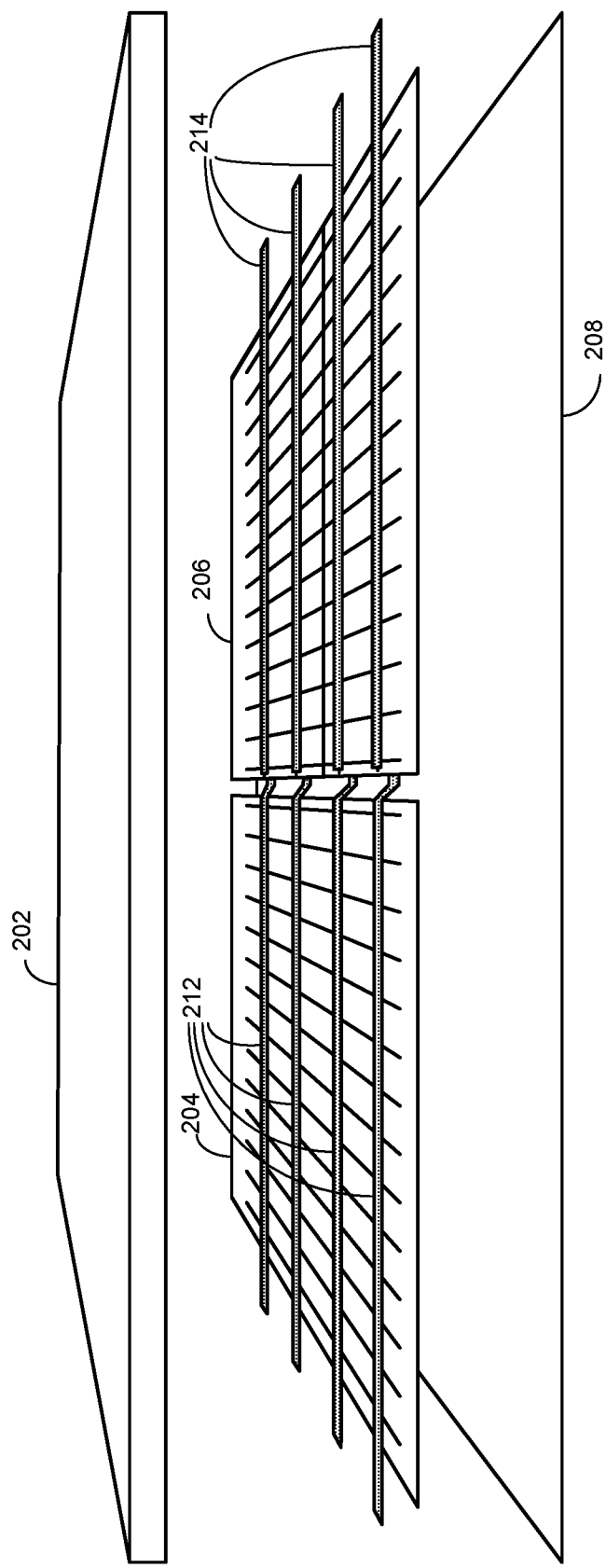
FIG. 2 shows a perspective view of the configuration of a photovoltaic roof tile, according to an embodiment.

FIG. 2 shows a perspective view of the configuration of a photovoltaic roof tile, according to an embodiment. In this view, solar cells 204 and 206 can be hermetically sealed between top glass cover 202 and backsheet 208, which jointly can protect the solar cells from the weather elements. Tabbing strips 212 can be in contact with the front-side electrodes of solar cell 204 and extend beyond the left edge of glass 202, thereby serving as contact electrodes of a first polarity of the PV roof tile. Tabbing strips 212 can also be in contact with the back side of solar cell 206, creating an in-series connection between solar cell 204 and solar cell 206. Tabbing strips 214 can be in contact with front-side electrodes of solar cell 216 and extend beyond the right-side edge of glass cover 202.

Using long tabbing strips that can cover a substantial portion of a front-side electrode can ensure sufficient electrical contact, thereby reducing the likelihood of detachment. Furthermore, the four tabbing strips being sealed between the glass cover and backsheet can improve the durability of the PV roof tile.

Figure 3:
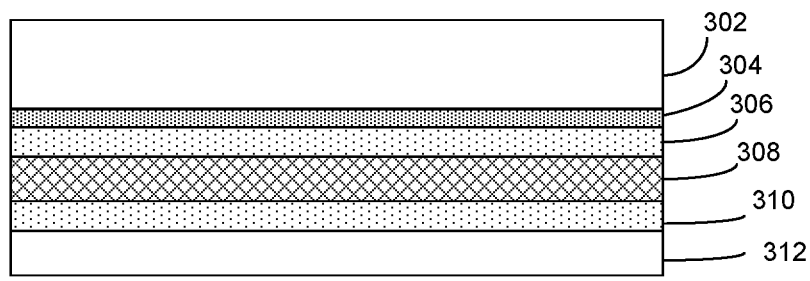
FIG. 3 shows the cross section of an exemplary photovoltaic roof tile, according to an embodiment.

FIG. 3 shows the cross section of an exemplary PV roof tile 300, according to an embodiment. In this example, solar cell or array of solar cells 308 can be encapsulated by top glass cover 302 and backsheet 312. Top encapsulant layer 306, which can be based on a polymer, can be used to seal between top glass cover 302 and solar cell or array of solar cells 308. Specifically, encapsulant layer 306 may include polyvinyl butyral (PVB), thermoplastic olefin (TPO), ethylene vinyl acetate (EVA), or N,N'-diphenyl-N,N'-bis(3-methylphenyl)-1,1'-diphenyl-4,4'-diamine (TPD). Similarly, lower encapsulant layer 310, which can be based on a similar material, can be used to seal between array of solar cells 308 and backsheet 312.

Roof tile 300 may also contain an optical filter layer 304 (also referred to as optical coating or color filter layer) that may comprise one or more layers of optical coating. Optical filter layer 304 is typically used to provide color to PV roof tile 300 (or to a PV module). Optical filter layer 304 may also provide other optical or aesthetic effects, and is not limited by the present disclosure. Optical filter layer 304 may contain a transparent conductive oxide (TCO) such as Indium Tin Oxide (ITO) or Aluminum-doped Zinc Oxide (AZO). Optical filter layer 304 may include a multi-layer stack containing one or more of: a high refraction index (e.g., n=1.7-2.5) material, such as $TiO_2$, $Ta_2O_5$, $NbO_2$, ZnO, $SnO_2$, $In_2O_3$, $Si_3N_4$, and AZO; a low refraction index (e.g., n=1.2-1.5) material, such as $SiO_2$, $MgF_2$; and a metal, such as Ag, Cu, and Au. Optical filter layer 304 can also include any combination of TCO and Si-based layers like a silicon nitride ($Si_xN_y$, where x and y are variable) and a silicon oxide ($SiO_x$ where x is variable). Optical filter layer 304 may be deposited by physical vapor deposition (PVD), chemical vapor deposition (CVD), plasma-enhanced CVD (PECVD), or other low-cost wet chemical deposition methods such as sol-gel coating or roll coating.

PV roof tiles and modules are described in more detail in U.S. Provisional Patent Application No. 62/465,694, entitled "SYSTEM AND METHOD FOR PACKAGING PHOTOVOLTAIC ROOF TILES" filed Mar. 1, 2017, which is incorporated herein by reference. The embodiments disclosed herein can be applied to solar cells, PV roof tiles, and/or PV modules.

Colored PV roof tiles and modules are described in more detail in U.S. patent application Ser. No. 15/294,042, entitled "COLORED PHOTOVOLTAIC MODULES" filed Oct. 14, 2016; and in U.S. patent application Ser. No. 15/259,194, entitled "UNIFORMLY AND DIRECTIONALLY COLORED PHOTOVOLTAIC MODULES" filed May 17, 2017, which are incorporated herein by reference.

Adhesion of Optical Filter-Encapsulant Interface

A PV roof tile's reliability can degrade over long term if adhesion between its encapsulant layer and color filter layer is insufficient. Adhesive forces as large as 100 N/cm, or more, are desirable between the optical filter layer (e.g., TCO) and the encapsulant layer (e.g., polymer) to ensure long-term reliability. By contrast, poor adhesive forces below about 35 N/cm may result in severe failure of a PV roof module or tile.

Figure 4A:
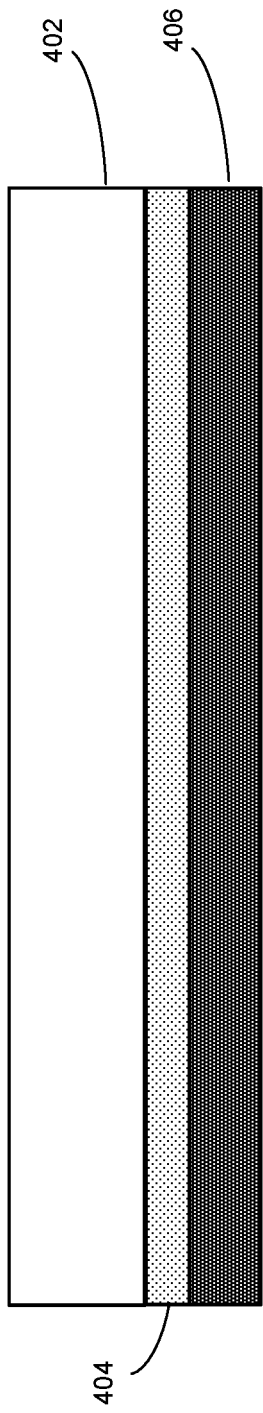
FIG. 4A shows exemplary photovoltaic roof tile layers with uncontaminated interfaces.

FIG. 4A shows exemplary photovoltaic roof tile layers with uncontaminated interfaces. As shown, front glass cover 402 includes optical filter layer 404 and interfaces with encapsulant layer 406. Note that insufficient adhesion is typically an issue with PV roof tiles that contain an optical filter layer such as layer 404, which can bond poorly to the encapsulant. In the example shown in FIG. 4A, the layers are in good operating condition. In particular, layers 402, 404, and 406 are clean, level, and contain no visible gaps, air bubbles, or contaminants.

On the other hand, if adhesion is poorly formed between the optical filter layer and encapsulant, a gap can form during processing of the PV roof tile. In particular, low adhesion strength (e.g., below 100 N/cm) can result in detachment of optical filter layer layer 404 and encapsulant layer 406, leading to the formation of gaps. Moreover, bubbles or gaps can appear during the roof tile's usage over time. The encapsulant and the optical filter layer may also separate and allow moisture to enter their interface. Existing encapsulant lamination and optical filter layer deposition processes used in existing PV roof tile systems typically cannot provide sufficient adhesive strength needed to prevent such degradation. For example, the adhesive force between an EVA encapsulant and optical filter of ITO or variants containing a small amount of inorganic cation additions such as Ti is only about 35 N/cm. Similarly, the adhesive force between the optical coating and TPO, a variant of polyolefin, is less than 10 N/cm.

Moreover, weak adhesion between the layers, leading to gaps and bubbles in the interface, can contribute to lost reliability over time. Thermal cycling during usage over time can exert stresses on the interface between different materials. Such stresses can eventually surpass the adhesive forces at the interface between the optical filter and encapsulant layers, leading to functional or mechanical failure.

Figure 4B:
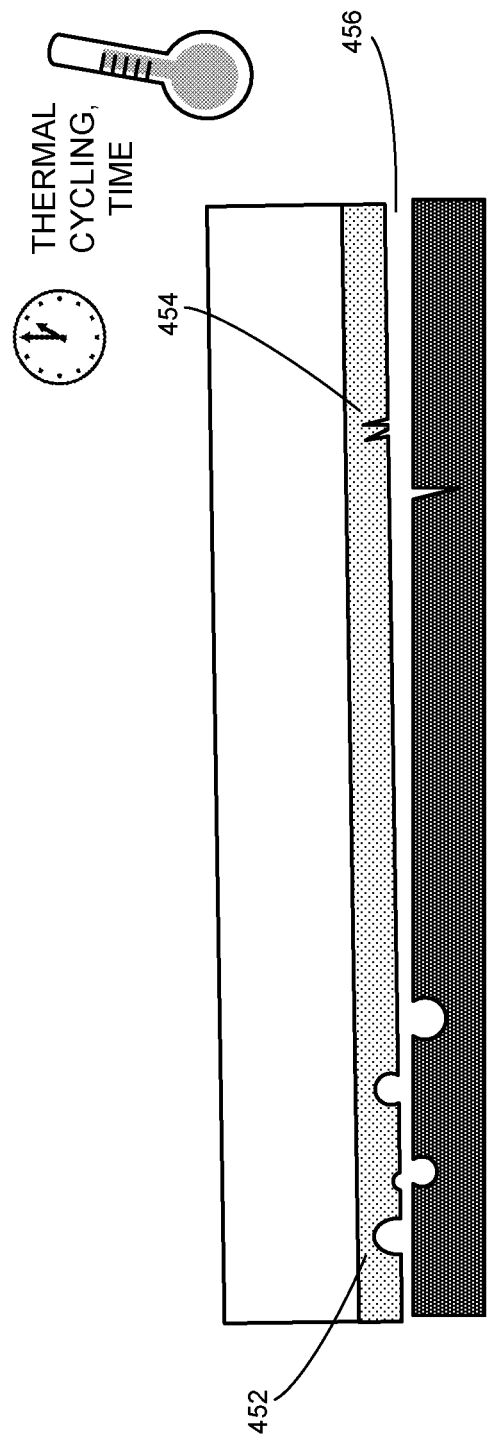
FIG. 4B shows exemplary photovoltaic roof tile layers with interfacial bubbles, gaps, and cracking resulting from thermal cycling or wear.

FIG. 4B shows exemplary photovoltaic roof tile layers with interfacial bubbles, gaps, and cracking resulting from thermal cycling or wear. As shown in this example, the PV roof tile can develop failures such as bubbles 452, cracks 454, and gap 456 as a result of insufficient adhesive force and thermal cycling. Such gaps and bubbles can degrade the roof tile and become a limiting factor on the tile's useful life.

Contamination of Optical Filter-Encapsulant Interface

Clearly, it is desirable to strengthen adhesion between the layers in order to prevent failures and extend the PV tile's useful life. In general, an interface between an inorganic material and an organic polymer can suffer from surface imperfections, which can weaken the bonding between these layers. The disclosed embodiments strengthen the adhesion by treating the optical filter layer, in order to reduce such surface imperfections, such as surface charge, dangling bonds, contaminants, air gaps, and cracks.

Figure 5:
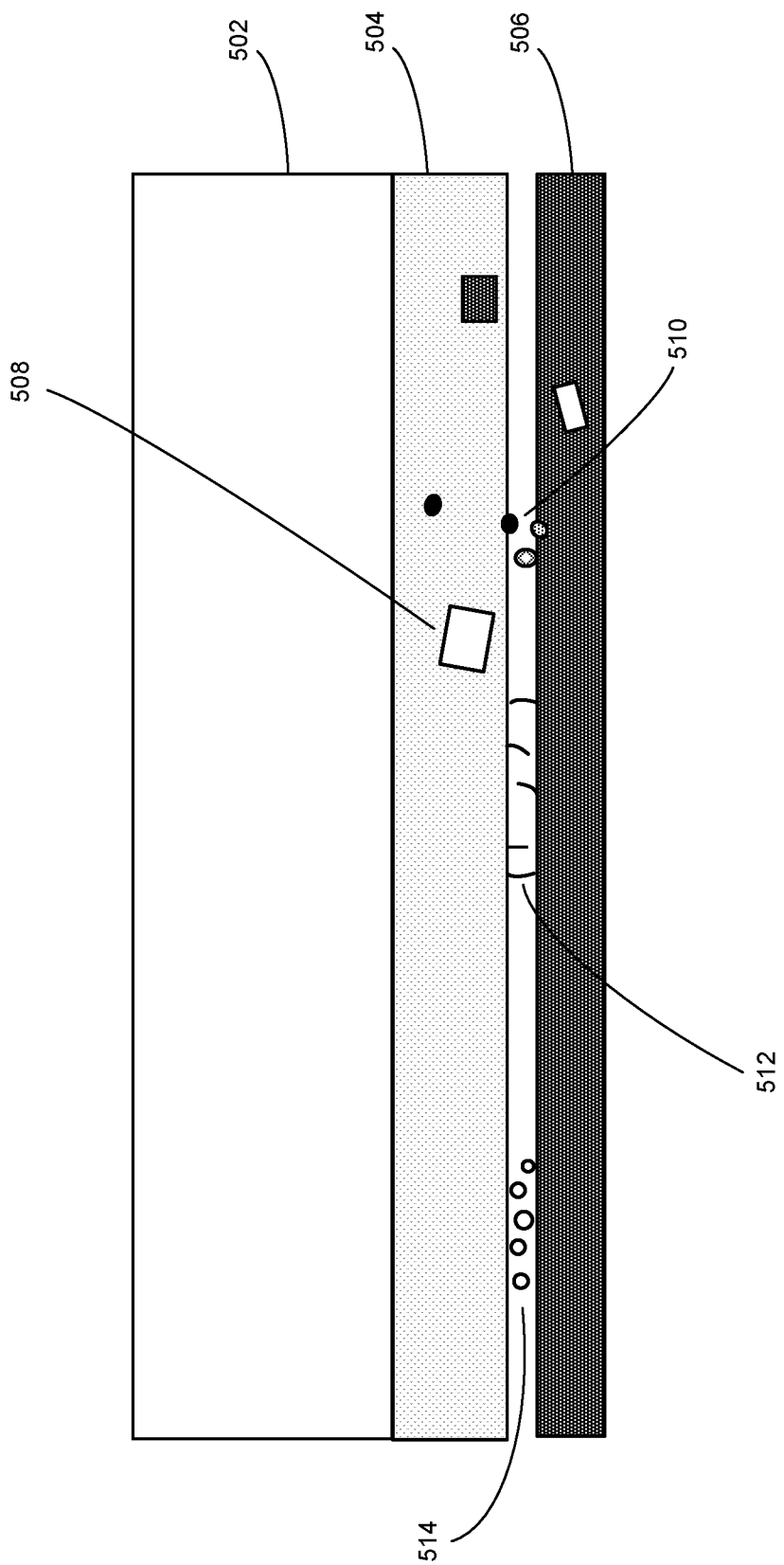
FIG. 5 shows an exemplary contaminated interface between an optical filter layer and an encapsulant layer.

A number of different types of surface imperfections may be present at an organic-inorganic interface. FIG. 5 shows an exemplary interface between an optical filter layer 504 and an encapsulant layer 506, wherein optical filter layer 504 is deposited on a glass cover 502. In this example, the interface contains defects or impurities 508, surface contaminants or particles 510, and dangling bonds or surface charges 512. In particular, during a plasma process such as PVD or PECVD, optical filter layer 504 can acquire residual surface charges 512. In addition, moisture 514 can enter into the interface. These various defects and imperfections can impair the interface's integrity, contributing to poor adhesion between encapsulant 506 (e.g., TPO) and optical filter layer 504. Note that insufficient adhesion may be present at an interface between organic and inorganic layers, which can include oxides other than TCO, for example, oxides that are not necessarily electrically conductive. In some embodiments, the oxides may include any combination of TCO and Si-based layers such as $Si_xN_y$ and $SiO_x$.

Interface Treatment and Surface Modification

Figure 6:
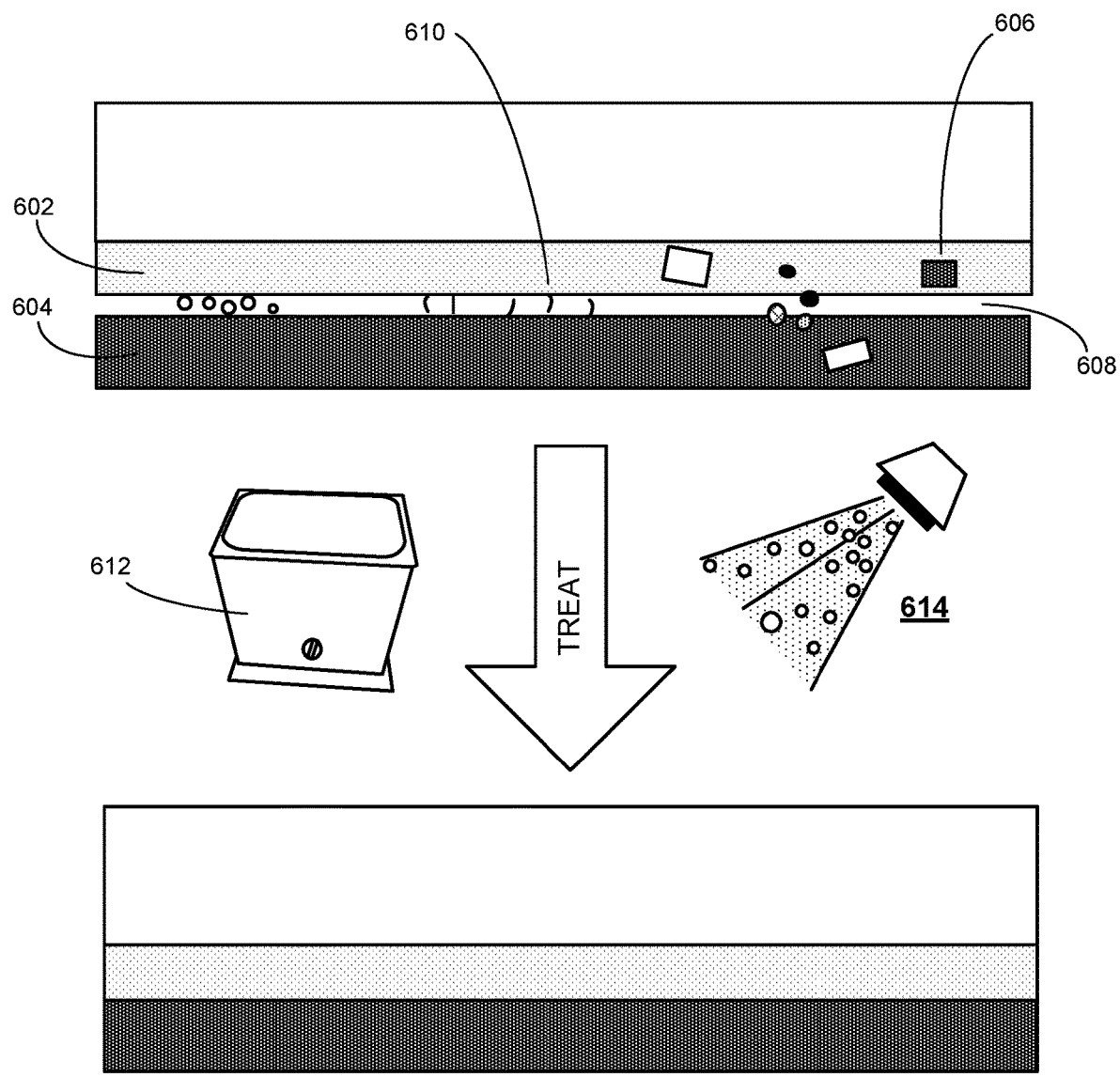
FIG. 6 illustrates treatment of an optical filter-encapsulant interface, according to an embodiment.

The disclosed processes and treatments can solve the problems described above, including the imperfections of an organic-inorganic (e.g., optical filter-encapsulant) interface, leading to poor adhesion of the interface and degraded reliability. FIG. 6 illustrates treatment of an optical filter-encapsulant interface, according to an embodiment. In this example, a PV roof tile contains an untreated interface between an optical filter layer 602, and an encapsulant layer 604. As shown, the untreated interface contains a number of imperfections, such as impurities 606, particles 608, and dangling bonds 610.

The interface is then treated, according to the embodiments disclosed herein. The treatment may include, for example, ultrasonic cleaning 612 or applying chemical treatment 614. The chemical treatment 614 can include a weak inorganic or organic acid or alkaline wash or dip, such as 2% to 4% sodium hydroxide (NaOH) solution, organic phosphonic acid, or hydroxyl-ethylidene-diphosphonic acid (HEDP, also called etidronic acid). The treatment can also include a cleaning agent. For example, ultrasonic cleaning 612 can involve rinsing with isopropyl alcohol (IPA) or another cleaning solvent. Note that cleaning the glass cover with the same rinse can also improve the uniformity and strength of adhesion between the glass surface and optical filter layer 602. In some embodiments, treating the interface may include applying other processes, substances, and/or equipment, and is not limited by the present disclosure.

The treatments disclosed herein can induce a surface modification to optical filter layer 602. Such a surface modification can include, but is not limited to, removing surface particles and contamination, passivating or neutralizing surface charges, reducing dangling bonds, and mechanically altering (such as texturizing) the optical filter surface. In particular, a mild inorganic acid or alkaline treatment can passivate residual surface charges on optical filter layer 602, in order to improve adhesion.

The surface modification and/or chemical treatment can strengthen adhesion by inducing strong bonding to the optical filter layer and the encapsulant. For example, treating an ITO surface with HEDP can produce strong ionic bonding between the ITO and the diphosphonic acid group on HEDP. Treating a polyolefin surface, which may comprise polyethylene, polypropylene, or a combination of both, with HEDP can produce strong covalent bonding between polyolefin and the non-polar ethylene group on HEDP. Also, the treatment disclosed herein has been demonstrated not to damage optical transmission or electronic conductivity of the optical filter layer (e.g., a TCO layer).

As a result of the treatments disclosed herein, the adhesive force between the optical filter and encapsulant layer can increase significantly, e.g., by five or more times. For example, the treatment of an ITO color filter layer with HEDP described above can result in an adhesive force greater than 170 N/cm, compared with 35 N/cm without treatment. Such a strong adhesive force is sufficient to maintain long-term reliability of the PV roof tile or module. Note that the disclosed embodiments can also be used to strengthen adhesion between inorganic materials and organic polymers for a variety of applications.

Figure 7A:
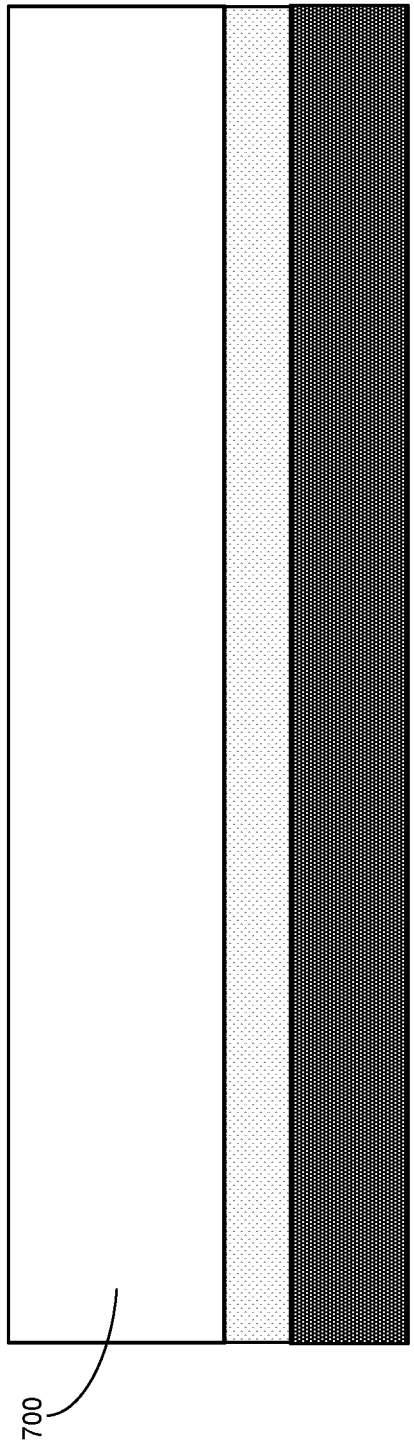
FIG. 7A illustrates an exemplary treated optical filter-encapsulant interface, according to an embodiment.

FIG. 7A illustrates an exemplary treated optical filter-encapsulant interface 700, according to an embodiment. As shown, treated interface 700 exhibits a significantly reduced number of impurities, particles, and dangling bonds. Moreover, the treated surfaces are less susceptible to gaps or bubbles. Consequently, the PV roof tile is expected to have a longer operational life.

Figure 7B:
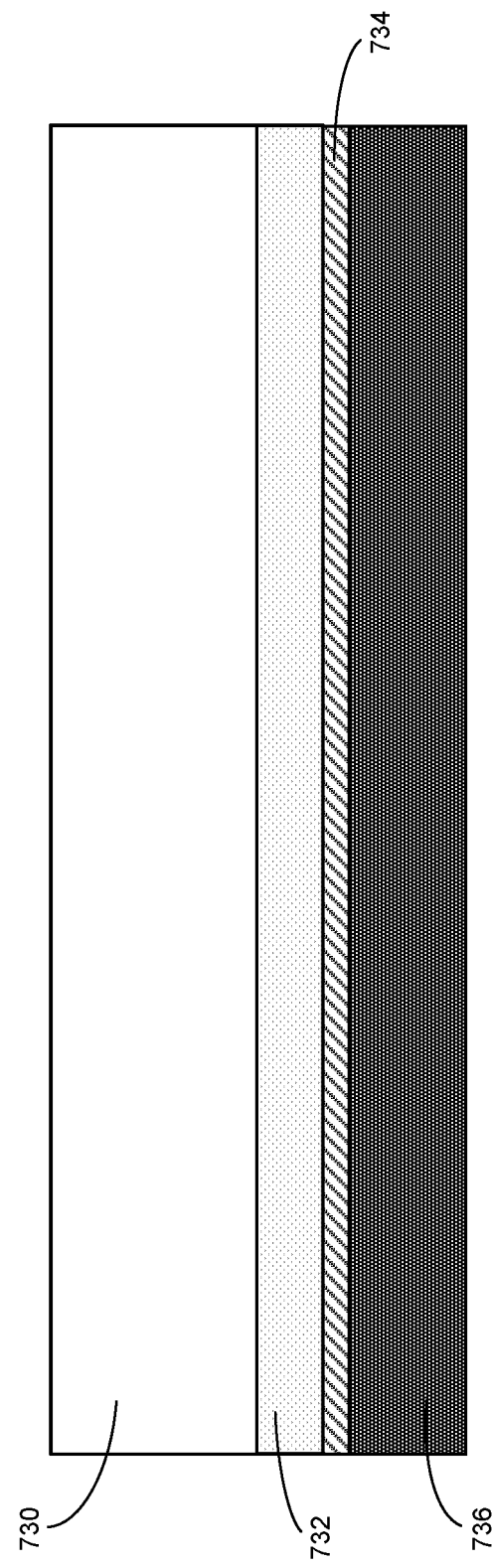
FIG. 7B illustrates surface modification in a treated optical filter-encapsulant interface, according to an embodiment.

As mentioned above, the treatment can result in a surface modification to the optical filter layer. This surface modification can include but is not limited to reducing or passivating surface charge, particles, dangling bonds, and other imperfections. FIG. 7B illustrates surface modification in a treated optical filter-encapsulant interface, according to an embodiment. In this example, a surface modification layer 734 is formed at the interface between optical filter (i.e., inorganic material) layer 732 and encapsulant (i.e., organic polymer) layer 736. Surface modification layer 734 may include strong chemical bonds, as described above. The desired surface modification layer may range from a sub-monolayer surface coverage to several monolayers' coverage.

Figure 7C:
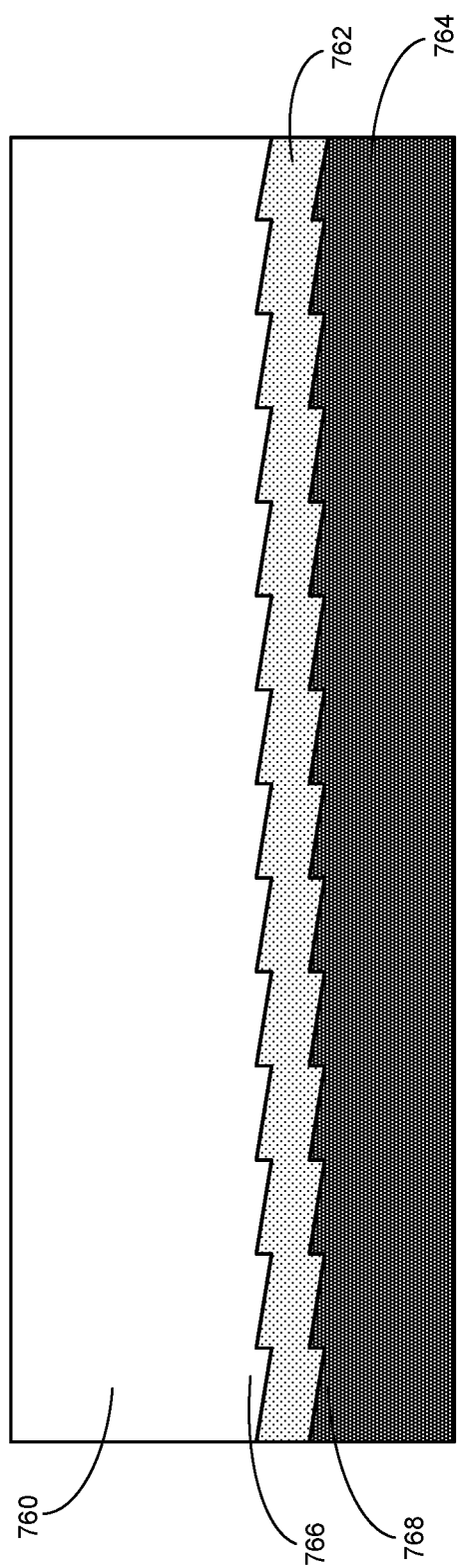
FIG. 7C illustrates an exemplary treated optical filter-encapsulant interface resulting in a textured surface, according to an embodiment.

In some embodiments, the surface modification can include texture or roughness in the glass' bottom surface in order to improve adhesion by increasing the adhesive contact area. FIG. 7C illustrates an exemplary treated optical filter 762-encapsulant 764 interface with glass cover 760, resulting in textured surfaces 766 and 768, according to an embodiment. Note that such texture on the glass' bottom surface 766 can be in addition to a patterned texture on one or more of the glass' surfaces, such as micro-texture or frosting to improve color uniformity, or an array of features for the purpose of reducing reflection losses. In the example of FIG. 7C, optical filter layer 762 follows the pattern of glass surface 766, so that surface 768 also displays the same textured pattern. The surface modification resulting in additional texture on surfaces 766 and/or 768 may improve adhesion due to a greater contact area with the polymer. Note this texture on the glass' bottom surface 762 could also have the effect of modifying the PV roof tile's color pattern because incident light's scattering, path length, etc., could change as a result of the texture.

Strengthening Adhesion of the Optical Filter-Encapsulant Interface

Figure 8:
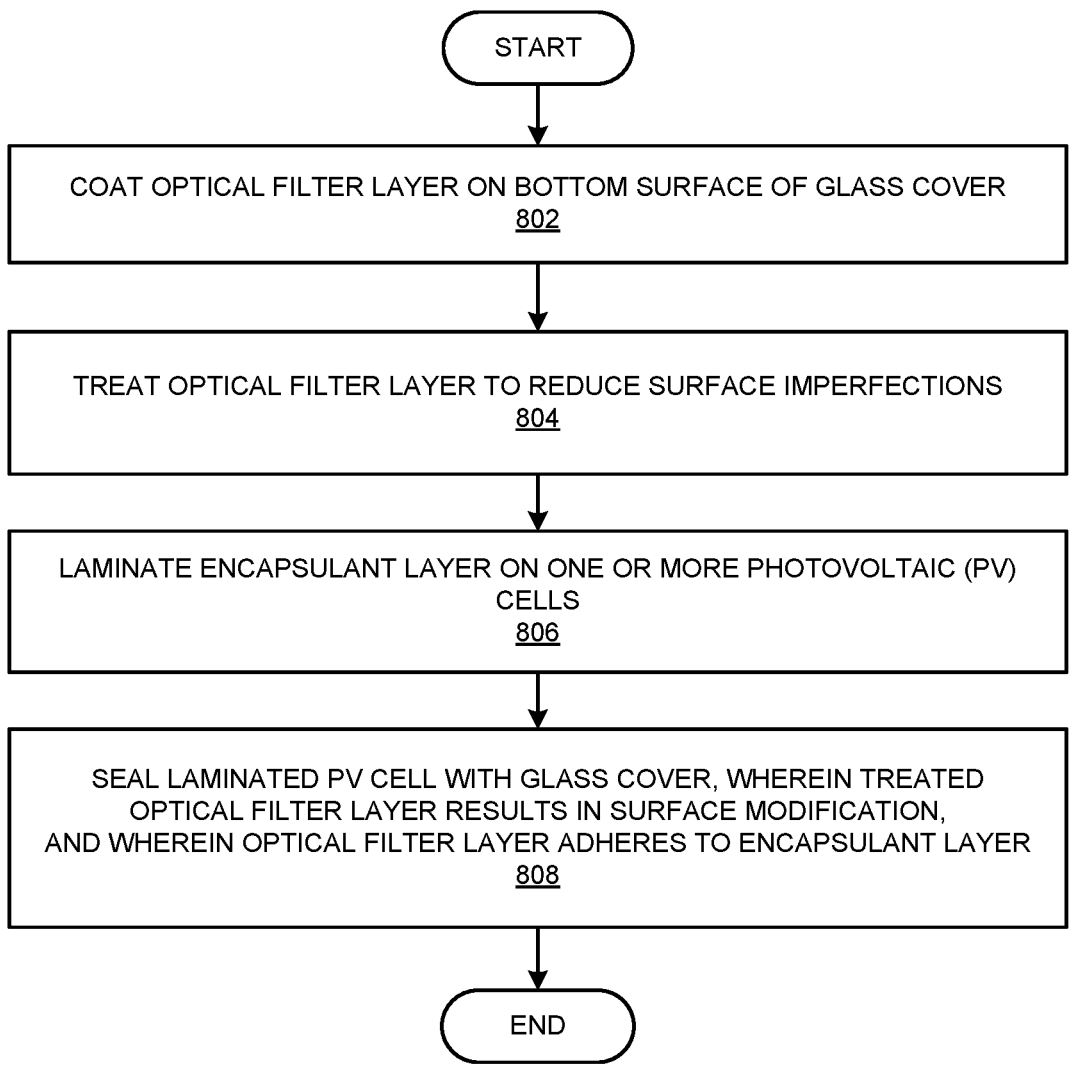
FIG. 8 shows a block diagram illustrating a process for strengthening adhesion of an optical filter layer to an encapsulant layer in a photovoltaic roof tile, according to an embodiment.

FIG. 8 shows a block diagram illustrating a process for strengthening adhesion of an optical filter layer to an encapsulant layer in a PV roof tile, according to an embodiment. The process includes coating an optical filter layer on a bottom surface of a glass cover (operation 802). The filter can include a TCO such as ITO or AZO, another oxide, or a metal, and can be deposited by PVD, CVD, or PECVD.

Next, the optical filter layer is treated to strengthen adhesion to the encapsulant layer (operation 804). In some embodiments, treating the optical filter layer may include ultrasonic cleaning or applying a chemical treatment. The chemical treatment can include an inorganic acid, inorganic alkaline, organic acid, organic phosphonic acid, 2-4% sodium hydroxide (NaOH) solution, IPA, or HEDP (also called etidronic acid). In some embodiments, ultrasonic cleaning involves using IPA or another cleaning solvent. In some embodiments, cleaning the glass cover can also improve the uniformity and strength of adhesion between the glass surface and optical filter layer.

Subsequently, an encapsulant layer is laminated on a PV cell (operation 806). As described above, the encapsulant may be a polymer or organic polymer such as PVB, TPO, EVA, or TPD. The process then comprises sealing the laminated PV cell with the glass cover (operation 808). In some embodiments, the treated optical filter layer induces a surface modification to the optical filter layer and/or to a bottom surface of the glass cover.

The foregoing descriptions of various embodiments have been presented only for purposes of illustration and description. They are not intended to be exhaustive or to limit the present system to the forms disclosed. Accordingly, many modifications and variations will be apparent to practitioners skilled in the art. Additionally, the above disclosure is not intended to limit the present system.

What is claimed is:

1. A process for strengthening adhesion of an optical filter layer to an encapsulant layer in a photovoltaic (PV) roof tile, the process comprising:
    coating an optical filter layer on a bottom surface of a glass cover, wherein the optical filter layer comprises an inorganic material;
    treating the optical filter layer to reduce surface imperfections and to form a treated optical filter layer;
    laminating an encapsulant layer on one or more PV cells to form one or more laminated PV cells, wherein the encapsulant layer comprises an organic material; and
    sealing the one or more laminated PV cells with the glass cover, wherein:
        either the treated optical filter layer contacts the encapsulant layer or a surface modification layer formed at the interface between the treated optical filter layer and the encapsulant layer,
        the treated optical filter layer results in a surface modification, and
        an adhesion strength between the treated optical filter layer and the encapsulant layer is greater than or equal to 100 N/cm.

2. The process of claim 1, wherein the optical filter layer comprises one or more of:
    a transparent conducting oxide (TCO);
    a silicon nitride ($Si_xN_y$);
    a silicon oxide ($SiO_x$);
    a material with a refraction index between 1.7 and 2.5;
    a material with a refraction index between 1.2 and 1.5; and
    a metal.

3. The process of claim 1, wherein treating the optical filter layer comprises applying a chemical treatment to the optical filter layer.

4. The process of claim 3, wherein the chemical treatment includes treating the optical filter layer with hydroxyl-ethylidene-diphosphonic acid (HEDP).

5. The process of claim 4, wherein the optical filter layer comprises indium tin oxide.

6. The process of claim 5, wherein the encapsulant layer comprises a polyolefin, and
    the process further comprises treating the encapsulant layer with HEDP.

7. The process of claim 3, wherein the chemical treatment includes treating the optical filter layer with one or more of:
    an inorganic acid;
    an inorganic alkaline;
    an organic acid;
    an organic phosphonic acid;
    a sodium hydroxide (NaOH) solution;
    isopropyl alcohol (IPA);
    hydroxyl-ethylidene-diphosphonic acid (HEDP);
    a weak acidic wash; and
    a weak alkaline wash.

8. The process of claim 1, wherein treating the optical filter layer includes ultrasonic cleaning.

9. The process of claim 8, wherein ultrasonic cleaning involves using one or more of:
    isopropyl alcohol (IPA); and
    a cleaning solvent.

10. The process of claim 1, further comprising producing a surface texture or roughness on the bottom surface of the glass cover to form a textured bottom surface of the glass cover.

11. The process of claim 10, wherein the surface of the treated optical filter layer has a texture following the textured bottom surface of the glass cover.

12. The process of claim 1, wherein the strengthened adhesion prevents moisture from entering an interface between the encapsulant layer and the optical filter layer.

13. The process of claim 1, wherein the encapsulant layer comprises polyvinyl butyral, thermoplastic olefin, ethylene vinyl acetate, or N,N'-diphenyl-N,N'-bis(3-methylphenyl)-1,1'-diphenyl-4,4'-diamine.

14. The process of claim 1, wherein the adhesion strength is greater than 170 N/cm.

15. The process of claim 1, wherein the treated optical filter layer contacts the surface modification layer formed at the interface between the optical filter layer and the encapsulant layer.

* * * * *